United States Patent [19]

Cluniat et al.

[11] Patent Number: 4,660,003

[45] Date of Patent: Apr. 21, 1987

[54] DEVICE FOR LIMITING THE POWER TRANSMISSION OF RADIOWAVE TRANSMITTERS

[75] Inventors: Claude Cluniat, Aubergenville; Michel Allanic, Herblay, both of France

[73] Assignee: Thomson-LGT, Chatou, France

[21] Appl. No.: 745,628

[22] Filed: Jun. 17, 1985

[30] Foreign Application Priority Data

Jun. 18, 1984 [FR] France .................. 84 09479

[51] Int. Cl.⁴ .................... H03H 7/24; H04B 1/18
[52] U.S. Cl. .................... 333/17 L; 330/136
[58] Field of Search ......... 333/17 L; 307/264, 540, 307/542, 555, 565; 328/162, 165; 330/136

[56] References Cited

U.S. PATENT DOCUMENTS

| | | | |
|---|---|---|---|
| 2,952,816 | 9/1960 | Miller | 330/136 X |
| 4,398,061 | 8/1983 | McMann, Jr. | 333/17 L X |
| 4,434,440 | 2/1984 | Schiff | |
| 4,574,248 | 3/1986 | Snodgrass | 330/136 X |

FOREIGN PATENT DOCUMENTS 2618524  11/1977  Fed. Rep. of Germany.

OTHER PUBLICATIONS

The Radio and Electronic Engineer, vol. 43, No. 5, May 1973, pp. 341-347; Londres, GB; W. Gosling: "Impulsive Noise Reduction in Radio Receivers".

Microwave Journal, vol. 18, No. 7, Jul. 1975, pp. 35-37, 44, Dedham, US; G. Berretta et al.: "Predicting Amplifier Performance for Multicarriers".

*Primary Examiner*—Paul Gensler
*Attorney, Agent, or Firm*—Oblon, Fisher, Spivak, McClelland & Maier

[57] ABSTRACT

The device for limiting the transmission power of radiowave transmitters comprises a limiting stage for attenuating the signal to be amplified before applying it to the input of the amplifying chain. A coupler collects part of the signal in order to apply it to the input of control means. A delay device is coupled between the coupler and the limiting stage and delays the signal to be amplifed before applying it to the input of the limiting stage. The control means block the limiting stage in order to prevent transmission of the signal to be amplified to the input of the amplifying chain when the level of the signal to be amplified overshoots a predetermined amplitude and hold the limiting stage in the blocked state after the level of the signal to be amplified has fallen back below the predetermined threshold during a sufficient period of time which is calculated so as to prevent any power overshoot.

8 Claims, 10 Drawing Figures

DEVICE FOR LIMITING THE POWER TRANSMISSION OF RADIOWAVE TRANSMITTERS

BACKGROUND OF THE INVENTION

1. Field of the Invention

The present invention relates to a device for limiting the power of transmission of radiowaves.

2. Description of the Prior Art

The invention is primarily applicable to devices for preventing any power overshoot within the amplifying chains of radiowave transmitters, these chains being in turn equipped with gain-regulating systems as well as systems for regulating the output power of the retransmission units.

In order to limit the output power of radiowave transmitters, it is a known practice to use power-limiting stages which usually precede the power-amplifying chain. These power-limiting stages are controlled by a detector which has the intended function of detecting any overshoot, or transition beyond the level of the signal with respect to a predetermined threshold, said detector being located either downstream or upstream with respect to the amplifying chain. Although these devices meet advanced design standards, there is not a single instance in which a device of this type proves fully satisfactory and power overshoots always take place. These power overshoots are usually of short duration and appear, for example, at the time of startup of the amplifying chains, at the time of accidental short-time interruptions in the supply of the transmitters or else in the event of accidental disconnections of transmission antennas or of their amplifying chains. It is readily apparent that, no matter how short they may be, these power overshoots usually produce adverse effects on the operation of the amplifying chains and are liable to result in damaging of certain semiconductor components or electron tubes which constitute the amplifying chains.

SUMMARY OF THE INVENTION

The aim of the invention is to overcome the disadvantages mentioned in the foregoing.

To this end, the invention is directed to a device for limiting the transmission power of a radiowave transmitter including a chain for amplification of the radio signal to be transmitted. Said device essentially comprises a limiting stage for attenuating the electric signal to be amplified before applying it to the input of the amplifying chain, a coupler for collecting at least part of the signal to be amplified, a delay device coupled between the coupler and the limiting stage for delaying the signal to be amplified which is delivered by the coupler before applying said signal to the input of the limiting stage, as well as control means coupled between the coupler and the control inputs of the limiting stage for blocking the limiting stage and preventing transmission of the signal to be amplified to the input of the amplifying chain when the level of the signal to be amplified oversteps a predetermined amplitude threshold and for holding the limiting stage in the blocked state after the level of the amplified signal has fallen back below the predetermined threshold during a period of time which is sufficient to ensure that the signal which has been delayed by the delay device and arrives at the input of the limiting stage cannot be amplified by the amplifying chain when its level still oversteps the predetermined amplitude threshold.

BRIEF DESCRIPTION OF THE DRAWINGS

Other features of the invention will be more apparent upon consideration of the following description and accompanying drawings, wherein.

DESCRIPTION OF THE PREFERRED EMBODIMENT

Figure 1:
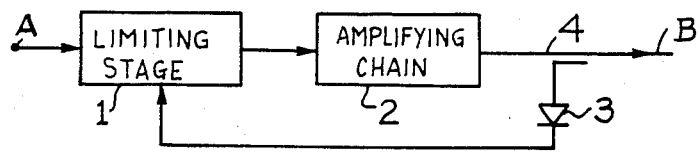
FIGS. 1 and 2 show power-limiting devices of the prior art.
Figure 2:
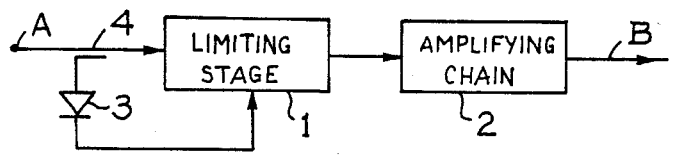

Power-limiting devices for amplifying chains of the type employed in the prior art are illustrated schematically in FIGS. 1 and 2. A typical device is constituted by a limiting stage 1 placed at the input of an amplifying chain 2. The limiting stage is controlled by an overshoot detector 3 having an input coupled to the input or to the output of the amplifying chain by means of a coupler 4.

In FIG. 1, when the level of the output signal of the amplifying chain 2 oversteps a predetermined amplitude threshold, the overshoot detector 3 controls the limiting stage 1 in order to attenuate the level of the signal applied to the input A of the amplifying chain via the limiting stage 1. The disadvantage of this device is that it fails to permit total limitation of transmission of the signal when its level oversteps the amplitude threshold predetermined by the detector 3 by reason of the fact that said detector 3 is necessarily capable of producing action only at an instant which is delayed with respect to the instant of appearance of overshoot of the signal above the predetermined amplitude threshold. This time-delay corresponds to the time of transit of the signal from the input A of the limiting stage 1 to the output B of the amplifying chain 2. This time interval must in addition be increased by the time of reaction of the limiting stage to overshoot of the signal, with the result that the overshoot time interval observed at the output B of the amplifying chain corresponds to addition of the transit and response times of the limiting stage 1, of the amplifying chain 2 and of the overshoot detector 3.

In the case of FIG. 2, the overshoot detector 3 produces action by means of the coupler 4 on the input signal which is applied to the input of the limiting stage 1. This arrangement appears more effective since it is not subject to the drawback encountered in FIG. 1 and arising from the time of transit of the signal through the limiting stage 1 and through the amplifying chain 2. Unfortunately, it is usually found that the time of transit between the input A and the output B of the limiting stage of the amplifying chain placed in series is distinctly shorter than the response time of the limiting stage, with the result that a signal having a higher level than the predetermined overshoot threshold is nevertheless amplified during a short instant by the chain formed by the limiting stage and the amplifying chain, this instant being such as to correspond to the time of action of the limiting stage.

Figure 3:
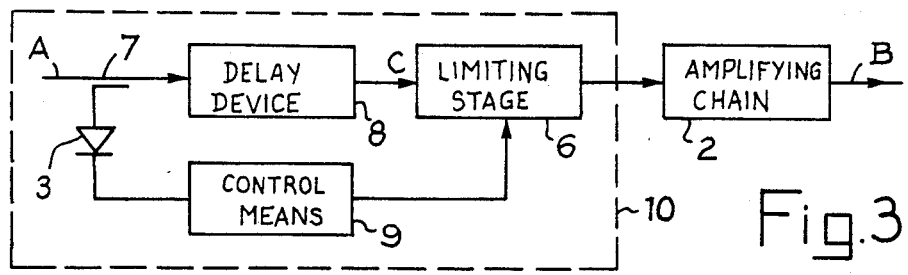
FIG. 3 is a schematic diagram showing the power-limiting device in accordance with the invention.

The device in accordance with the invention which is shown in the schematic diagram of FIG. 3 within a dashed-line rectangle 10 makes it possible to overcome these disadvantages. As in the case of FIGS. 1 and 2, this device comprises a limiting stage 6 placed at the input of the amplifying chain 2 and further comprises (as in the case of FIG. 2) a coupler 7 for collecting at least part of the signal to be amplified, this signal being applied to the input of the amplifying chain via the limiting stage 6. In contrast to FIG. 2, a delay device 8 having a time-delay constant $\tau_2$ connects the coupler 7 to the input of the limiting stage 6 and control means 9 produce action on the control inputs of the limiting stage 6 on the basis of threshold-overshoot information supplied by an overshoot detector 3 connected to the coupler 7.

The operation of the device shown in FIG. 3 is analyzed below in accordance with a first assumption which consists in disregarding the influence of the time-delay $\tau_2$ and in accordance with a second assumption which utilizes the influence of the time-delay $\tau_2$ in the transmission of the signal from point A to point B.

Figure 4:
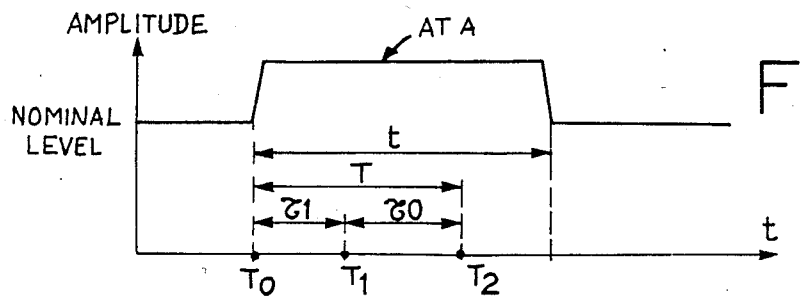
FIGS. 4 and 5 are time graphs representing the operation of the power-limiting device in accordance with the invention, no provision being made for the delay device placed between the input of the power-limiting device and the limiting stage.
Figure 5:
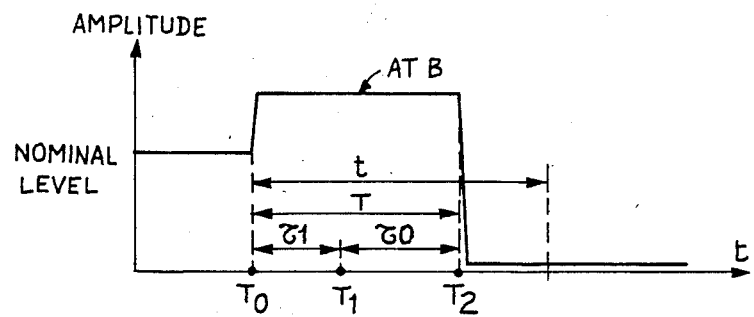

The operation in the event of a zero time-delay $\tau_2$ is illustrated in FIGS. 4 and 5 which show from an instant $T_O$ an overshoot of the signal applied to the input A of the device above the nominal operating level. The signal at A is collected by the coupler 7 and is transmitted to the limiting stage 6 with a time-delay $\tau_1$ corresponding to the response time of the control means 9 and the limiting stage 6 responds to the action of the control means 9 after a time-delay $\tau_0$ corresponding to the response time of the limiting stage 6. Under these conditions, the signal transmitted to the output B of the amplifying chain is limited only at the end of an instant T equal to the sum of the time-delay constants $\tau_1$ and $\tau_0$ of the control means 9 and of the limiting stage 6. Under these conditions, if the time-duration t of overshoot of the signal which is present at the point A above its nominal level is shorter than the time interval T, the limiting stage 6 does not produce any action on the signal which is present at point B at the output of the amplifying chain 2. In this case, a power overshoot takes place throughout the duration t of overshoot of the signal at point A. On the other hand, if the time-duration t of the signal overshoot exceeds the time interval T, the limiting stage produces action on the signal obtained at point B at the output of the amplifying chain at an instant $T_2$ which is separate from the instant $T_0$ of appearance of overshoot of the time interval T. However, during the time interval $T=\tau_1+\tau_0$, the limiting stage remains totally inoperative.

Figure 6:
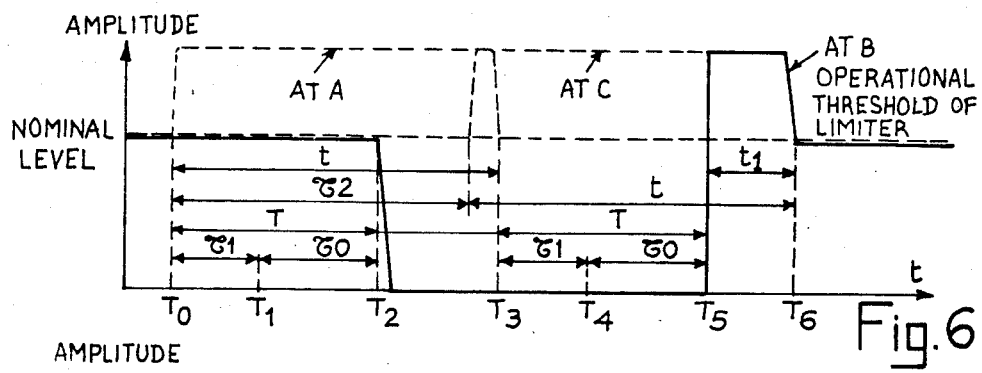
FIG. 6 is a time graph showing the operation of the power-limiting device in accordance with the invention, provision being made in this case for the delay device which is placed between the input of the power-limiting device and the input of the limiting stage.
Figure 7:
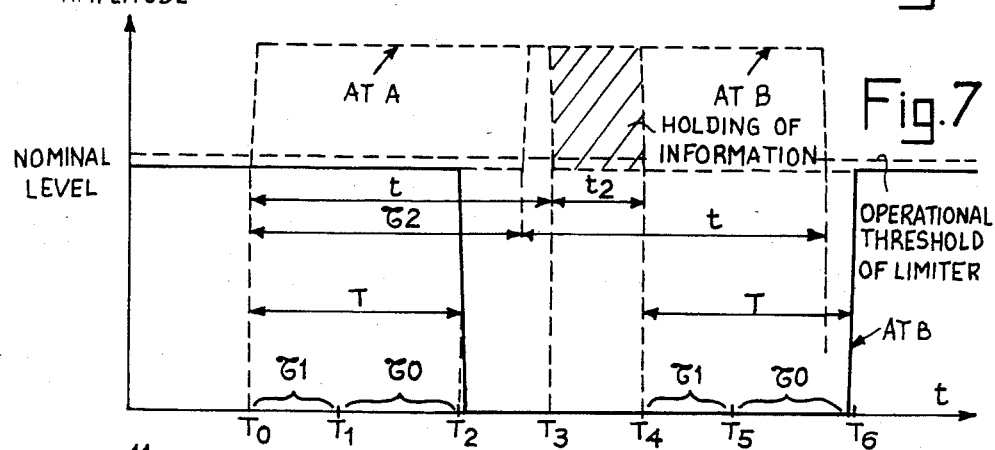
FIG. 7 is a time graph representing the operation of the power-limiting device in accordance with the invention, provision being made for a delay device located between the input of the power-limiting device and the limiting stage and for control means comprising a device for holding the overshoot information in order to block the limiting stage during a sufficient period of time to ensure that the overshoot information delivered by the delay device cannot have any effect on the input of the power-amplifying chain.

The operation of the device proves to be very different if the time-delay $\tau_2$ of the delay device 8 becomes significant; by establishing for example the time-delay $\tau_2$ at a value which is higher than or equal to the sum of the time-delays $\tau_1+\tau_0$, the response of the device to an amplitude overshoot of the input signal becomes the response shown in FIG. 6 during the elementary instants $T_0$, $T_1$ and $T_2$ corresponding to the period T. The leading edge of the signal which arrives at A and passes through the delay device 8 does not yet arrive at the input C of the limiting stage 6 at the end of the instant $T_2$ at which locking of the limiting stage 6 is in fact initiated. Locking of the limiting stage is maintained after an instant $T_3$ which marks the instant of fall of the signal applied to point A at its normal level during another period of time T corresponding once again to the time of de-activation of the limiting stage 6 up to the instant $T_5$. However, if at the instant $T_5$, the signal delivered by the delay device 8 and applied to point C at the input of the limiting stage 6 again passes beyond the nominal level, the device of FIG. 3 cannot stop progression of the signal through the amplifying chain and a power overshoot takes place during a period $t_1$ extending from the instant $T_5$ to the instant $T_6$ in FIG. 6. This power overshoot can be prevented if the control means comprise a device for holding the overshoot information beyond the time-duration of the period t of signal overshoot at point A. This information-holding operation is so determined, for example, as to last for a time interval $t_2$ chosen so as to ensure that t is of higher value than the time-duration t of overshoot of the signal which is present on the input A of the device increased by the time interval $t_1$ defined earlier. There will be chosen for example a value $t_2$ such that the relation $t_2 \geq t + \tau_2 - (\tau_1 + \tau_0)$ is verified. When this condition is satisfied, the instants $T_4$, $T_5$ and $T_6$ previously defined in FIG. 6 are then increased by the time interval $t_2$ in the manner shown in FIG. 7.

One example of application of the device in accordance with the invention to the construction of an amplifying chain of a television transmitter will now be described with reference to FIG. 8 which shows within a dashed-line rectangle 10 a power-limiting device in accordance with the invention which is inserted between a television signal transmission source 11 and a television signal amplifying chain 12, the output of which is coupled to an antenna 13. The television signal transmission source 11 comprises in known manner a sound modulator 14 and an image modulator 15. The output of the sound modulator 14 is connected to a first input of a summing device 16, the second input of which is connected to the output of the image modulator 15 through the power-limiting device 10 in accordance with the invention. As in the case of the device described with reference to FIG. 3, the power-limiting device 10 comprises a coupler 17, a delay device 18, a limiting stage 19 controlled by the control means 20, shown within a dashed-line rectangle and constituted by an amplifier 21, a detector 22 and a threshold comparator 23, all three of which are connected in series, and a sweep generator 24 placed between one control input of the limiting stage 19 and the output of the detector 22. The input of the control means 20 is constituted by the input of the amplifier 21 which is connected to the coupler 17 in much the same manner as the control means 9 of FIG. 3 in order to collect at least part of the input signal delivered by the image modulator 15 to the input of the amplifier 21 in order to amplify and transfer said signal fraction via the detector 22 to the input of the threshold comparator 23. The threshold comparator 23 produces direct action on a control input of the limiting stage 19 in order to prevent transfer of the output signal from the summing device 16 to the amplifying chain when the level of the signal collected by the coupler 17 oversteps the predetermined comparison threshold within the threshold comparator 23. The amplifying chain 12 is constituted in known manner by a power preamplifier 25 followed by a power amplifier 26. Said amplifying chain comprises a mixing stage 27 for modulating a carrier signal delivered by the local oscillator 28 by means of the video signal delivered at the output of the limiting stage 19. The chain further comprises a regulating chain for stabilizing the gain of the amplifier, said regulating chain being constituted in known manner by a coupler 29 connected between the output of the power preamplifier 25 and the amplifier 26, an automatic gain control (AGC) device 30 coupled between the coupler 29 and one control input of the limiting stage 19 in order to permit adjustment of the attenuation factor of the limiting stage 19 as a function of the level of the signal amplified by the power preamplifier 25. The negative feedback ratio is controlled in known manner by a variable potentiometer 31 which produces action on the automatic gain control device 30 in such a manner as to establish the negative feedback ratio of the loop thus formed at a predetermined value. The sweep generator 24 permits slow activation of the limiting stage 19 at the time of progressive restarting after any cutoff produced by overstepping of the video signal above its nominal amplitude.

One example of application of the device in accordance with the invention to the construction of a television signal retransmission unit will now be described with reference to the diagram of FIG. 9. The device in accordance with the invention is shown in FIG. 9 within a dashed-line rectangle 32 and located between a receiving chain 33 and a transmission chain 34. As in the case of FIG. 8, the device shown within the dashed-line rectangle 32 comprises a limiting stage 35, a delay device 36 and a coupler 37 connected in this order in series. The device further comprises an amplifier 38, a detector 39 and a threshold comparator 40 coupled between one output of the coupler 37 and one control input of the limiting stage 35 as well as a sweep generator 41 connected to the output of the detector 39 so as to control the limiting stage 35 in a progressive manner. The receiving portion 33 of the retransmission unit shown in FIG. 9 comprises in known manner an input filter 42A, the input of which is coupled to a receiving antenna 43 and the output of which is connected to the input of an amplifier 43B. The amplifier 43B is coupled to one input of a mixer 44 which is excited on a second input by a local oscillator 45 for the purpose of converting the carrier frequency of the television signals received by the antenna 43 to an intermediate frequency FI. The intermediate frequency signal FI is applied via the output of the mixer 44 to the input of a filter 42B which filters said signal in order to apply it to the input of the coupler 37 of the limiting device 32 in accordance with the invention via a variable-gain amplifier 46 controlled by an automatic gain control device 47, the attenuation parameters of which are adjusted by means of a potentiometer 48. The transmission device 34 comprises in known manner an amplifying chain constituted by a power amplifier 49 which produces action on a transmission antenna 50 and amplifies the signals delivered by a power preamplifier 51 connected to the input of the amplifier 49 through a coupler 52. The power preamplifier 51 is connected to the output of the limiting stage through mixer 55. The mixer modulates a carrier signal delivered by local oscillator 56 by the output signal of the limiting stage. The coupler 52 is connected by means of an automatic gain control device 53, which is controlled by a potentiometer 54, to a third control input of the limiting stage 35 of the device in accordance with the invention in order to set the limiting stage 35 at its maximum attenuation at the time of turn-on of the retransmission unit of FIG. 9 and consequently to prevent any power amplification by the amplifying chain formed by the amplifiers 49 and 51 during the transient period of startup of the installation.

Figure 8:
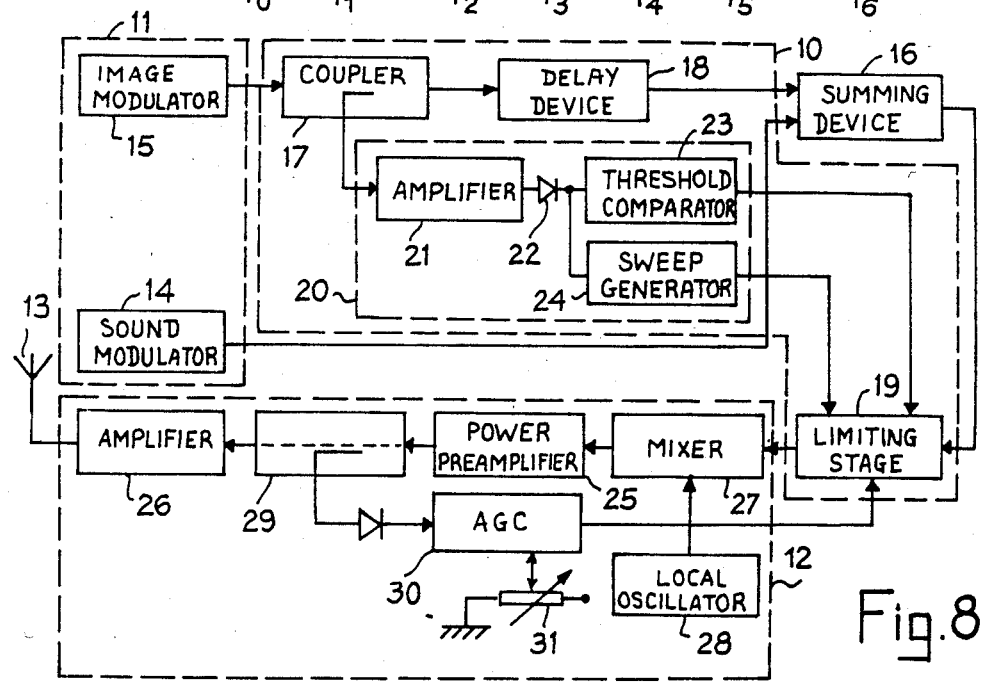
FIG. 8 is a diagram of a power transmitter equipped with the power-limiting device in accordance with the invention.
Figure 9:
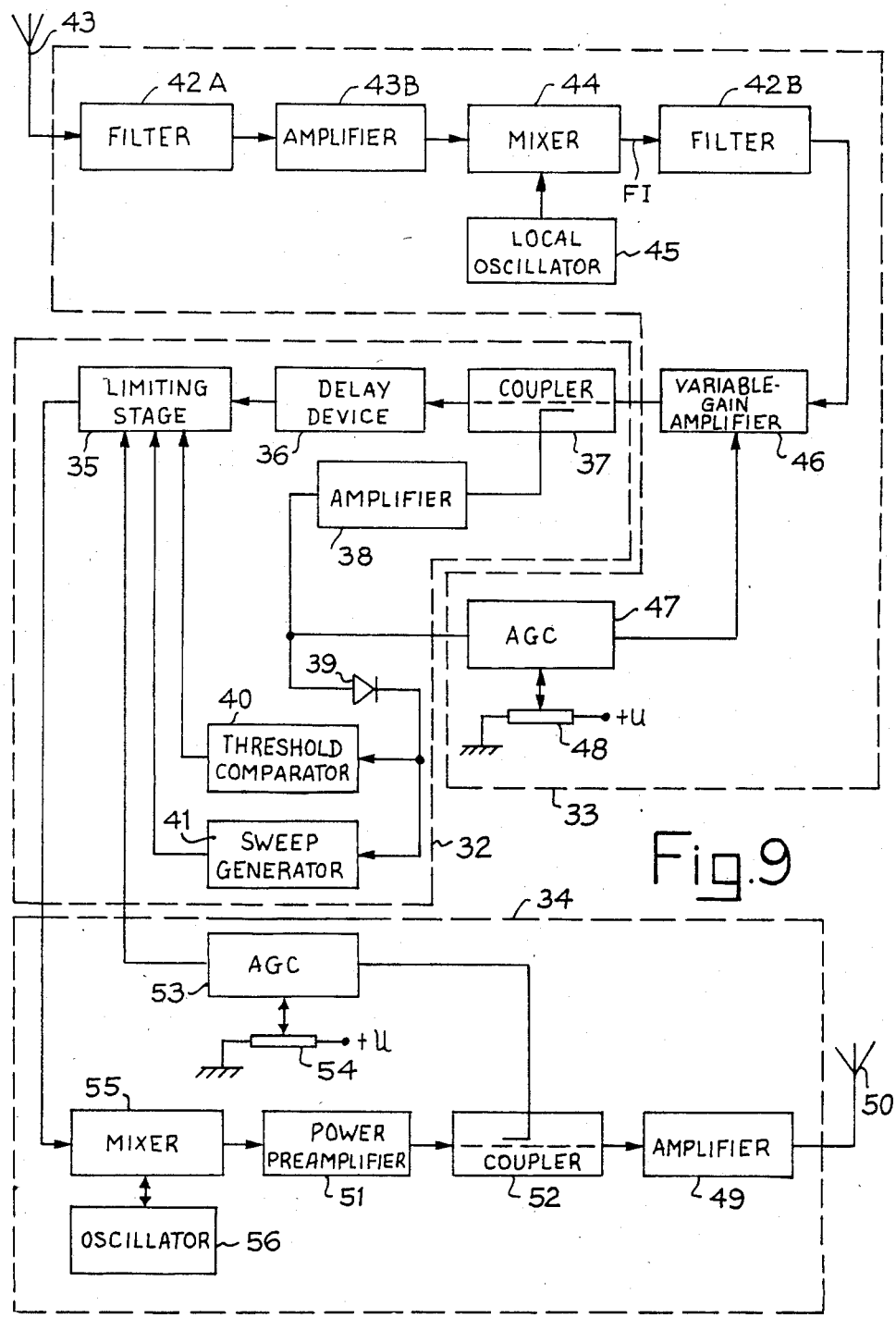
FIG. 9 is a diagram of a power retransmission unit equipped with a power-limiting device in accordance with the invention.
Figure 10:
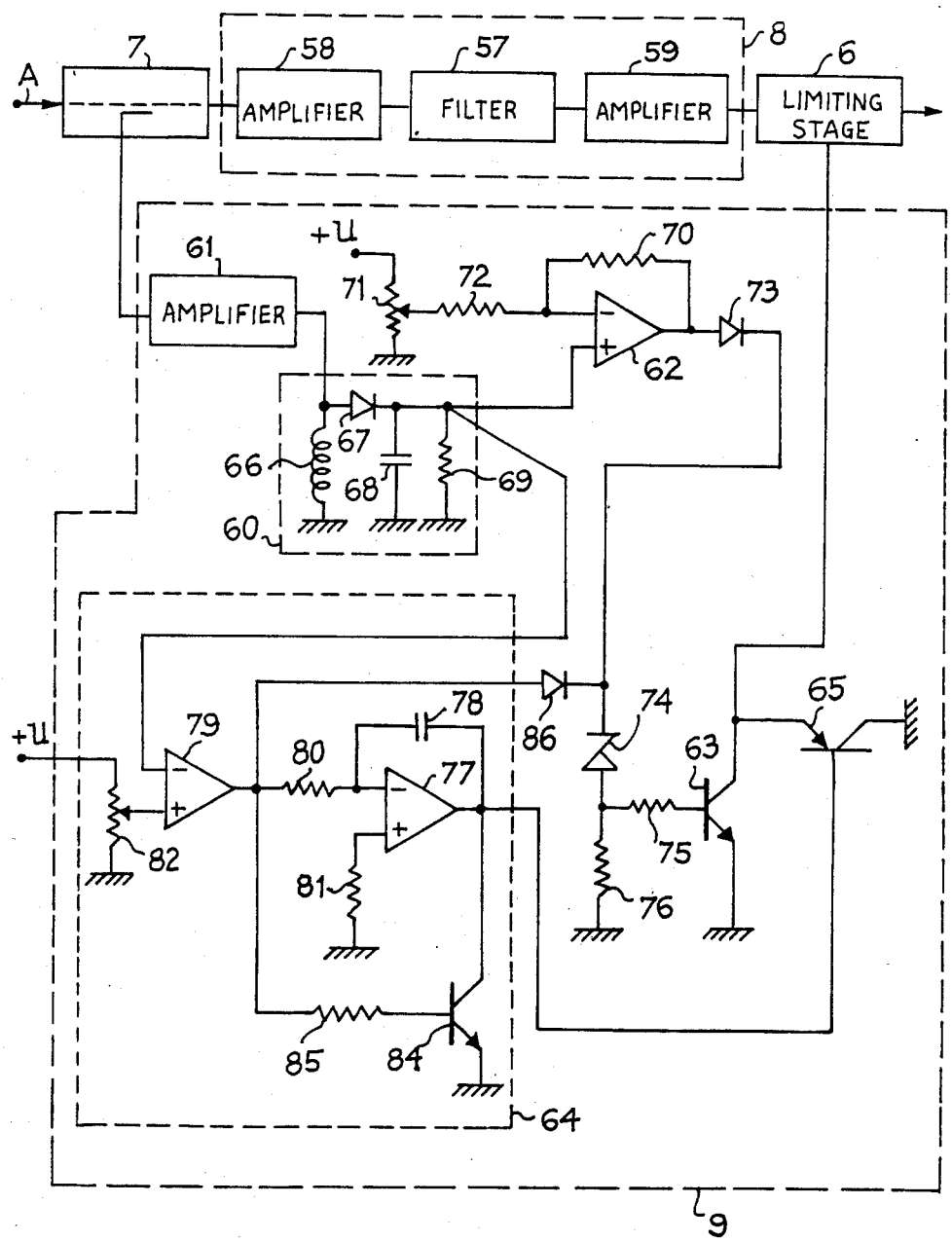
FIG. 10 is a detailed diagram of the device in accordance with the invention.

A more detailed illustration of the device in accordance with the invention which has just been described with reference to FIG. 3 and the applications of which are shown in FIGS. 8 and 9 will now be described with reference to the example of construction of FIG. 10. In FIG. 10, the delay device 8 shown within a dashed-line rectangle comprises a surface-wave filter 57 located between two amplifiers 58 and 59. The control means 9 which are also shown within a dashed-line rectangle comprise a signal detector 60 coupled to one output of the coupler 7 through an amplifier 61, a comparator amplifier 62, the output of which is coupled to the input of a transistor 63 for blocking the limiting stage 6 which may consist of an electronic attenuator of the pin-diode type, a sweep generator 64 shown within a dashed-line rectangle as well as a transistor 65 for blocking the limiting stage 6 at the time of turn-on of the amplification circuits. The detector 60 comprises an inductance 66 coupled between the output of the amplifier 61 and the general ground of the circuits of the device shown in FIG. 10, a detector diode 67, the anode of which is connected to the output of the amplifier 61 and the cathode of which is connected to one end of a capacitor 68, the other end of which is connected to the general ground of the circuit shown in FIG. 10, as well as a resistor 69 of very high value. The diode 67 permits rapid charging of the capacitor 68 by means of the signal delivered by the output of the amplifier 61 when the potential of its anode is higher than the potential of its cathode while also permitting slow discharge of the capacitor 68 through the resistor 69 when, conversely, the level of the signal which is present at the output of the amplifier 61 is lower than the voltage level which is present on the cathode of the diode 67. The comparator 62 is constituted by a differential operational amplifier having a "−" input and a "+" input, the "−" input being connected on the one hand to the output of the amplifier 62 by means of a resistor 70 and on the other hand to the sliding contact of a potentiometer 71 which is supplied between the potential of the ground circuit and a voltage +U in order to define the reference potential corresponding to the overshoot threshold of the signal applied to the input A of the device. The output of the amplifier 62 is connected to the base of the transistor 63 through a diode 73, a Zener diode 74 and a resistor 75 which are connected in series respectively in this order between the output of the amplifier 62 and the base of the transistor 63. The ends which are common to the Zener diode 74 and to the resistor 75 are connected to the ground circuit of the device of FIG. 10 by means of a resistor 76. The transistor 63 is mounted as a current switch, its emitter is connected to the ground circuit of the device and its collector is connected to the control input of the limiting stage 6. The detector 60 and the comparator amplifier 62 connected to the transistor 63 determine the holding period $t_2$ described earlier. This period is determined by the discharge of the capacitor 68 through the high-value resistor 69 from the instant at which the overshoot signal received by the amplifier 61 which is connected to the output of the coupler 7 detects a fall of the overshoot signal which is present at the input A of the device. The sweep generator 64 is constituted in known manner by an integrator formed by an operational amplifier 77 having a "−" input and a "+" input, the "−" input being connected to the output of the operational amplifier by means of a capacitor 78 and to the output of a threshold detector 79 by means of a resistor 80. The "+" input of the amplifier 77 is connected in known manner to the general ground of the device by means of a resistor 81. The threshold detector 79 is formed by an operational amplifier which also has a "−" input and a "+" input, the "+" input being biased at a constant voltage value by means of a potentiometer 82, the ends of which are supplied with a direct-current voltage +U. The "−" input of the amplifier 79 is connected to the output of the detector 60 in such a manner as to ensure progressive startup of the limiting stage after any blocking caused by a signal overshoot at point A of the device. The base of a transistor 84 is connected to the output of the amplifier 79 by means of a resistor 85, its collector is connected to the output of the amplifier 77 and its emitter is connected to the general ground of the circuit so as to reset the integrator to zero when the level of the signal at the input A of the device again becomes correct.

What is claimed is:

1. A device for limiting the transmission power of a radiowave transmitter including a chain for amplification of the radio signal to be transmitted, comprising a limiting stage, having control inputs, for attenuating the electric signal to be amplified before applying it to the input of the amplifying chain, a coupler for generating a control signal equal to at least part of the signal to be amplified, a delay device coupled between the coupler and the limiting stage for delaying the signal to be amplified which is delivered by the coupler before applying said signal to the input of the limiting stage, as well as control means coupled between the coupler and the control inputs of the limiting stage and responsive to the control signal for blocking said limiting stage and preventing transmission of the signal to be amplified to the input of the amplifying chain when the level of the signal to be amplified oversteps a predetermined amplitude threshold and for holding the limiting stage in the blocked state after the level of the signal to be amplified has fallen back below the predetermined threshold during a sufficient period of time $t_2$ to ensure that the signal which has been delayed by the delay device and arrives at the input of the limiting stage cannot be amplified by the amplifying chain when its level still oversteps the predetermined amplitude threshold.

2. A device according to claim 1, wherein the time $t_2$ of blocking of the limiting stage is so determined as to verify the relation $t_2 \geq t + \tau_2 - (\tau_1 + \tau_0)$ where t designates the time interval during which the signal present at the input of the coupler exceeds the predetermined amplitude threshold value $\tau_2$ designates the time-delay constant of the delay device $\tau_1$ designates the delay in reaction of the control means to the signal overshoot amplitude $\tau_0$ designates the delay in reaction of the limiting stage to the action of the control means.

3. A device according to claim 1, wherein the delay device is formed by a surface-wave filter.

4. A device according to claim 1, wherein the limiting stage is constituted by an electronic attenuator of the pin-diode type.

5. A device for limiting the transmission power of a radiowave transmitter including a chain for amplification of the radio signal to be transmitted, comprising a limiting stage, having control inputs, for attenuating the electric signal to be amplified before applying it to the input of the amplifying chain, a coupler for generating a control signal equal to at least part of the signal to be amplified, a delay device coupled between the coupler and the limiting stage for delaying the signal to be amplified which is delivered by the coupler before applying said signal to the input of the limiting stage, as well as control means coupled between the coupler and the control inputs of the limiting stage and responsive to the control signal for blocking said limiting stage and preventing transmission of the signal to be amplified to the input of the amplifying chain when the level of the signal to be amplified oversteps a predetermined amplitude threshold and for holding the limiting state in the blocked state after the level of the signal to be amplified has fallen back below the predetermined threshold during a sufficient period of time $t_2$ to ensure that the signal which has been delayed by the delay device and arrives at the input of the limiting stage cannot be amplified by the amplifying chain when its level still oversteps the predetermined amplitude threshold, said control means comprise a detector for storing the amplitudes of overshoot of the signal to be amplified, said detector being coupled to a threshold comparator for blocking the limiting stage when the amplitude of the signal to be amplified overshoots a predetermined threshold.

6. A device according to claim 5, wherein the detector for storing the signal overshoot amplitudes comprises a capacitor connected to the coupler through at least one diode which is in the conducting state when the level of the signal obtained from the coupler is higher than the amplitude of the signal stored within the capacitor.

7. A device according to claim 6, wherein the detector for storing the overshoot amplitudes comprises means for slow discharge of the capacitor, said means being put into action when the level of the signal obtained from the coupler is lower than the amplitude of the signal stored in the capacitor.

8. A device for limiting the transmission power of a radiowave transmitter including a chain for amplification of the radio signal to be transmitter, comprising a limiting stage, having control inputs, for attenuating the electric signal to be amplified before applying it to the input of the amplifying chain, a coupler for generating a control signal equal to at least part of the signal to be amplified, a delay device coupled between the coupler and the limiting stage for delaying the signal to be amplified which is delivered by the coupler before applying said signal to the input of the limiting stage, as well as control means coupled between the coupler and the control inputs of the limiting stage and responsive to the control signal for blocking said limiting stage and preventing transmission of the signal to be amplified to the input of the amplifying chain when the level of the signal to be amplified oversteps a predetermined amplitude threshold and for holding the limiting stage in the blocked state after the level of the signal to be amplifed has fallen back below the predetermined threshold during a sufficient period of time $t_2$ to ensure that the signal which has been delayed by the delay device and arrives at the input of the limiting stage cannot be amplififed by the amplifying chain when its level still oversteps the predetermined amplitude threshold, and a sweep generator for initiating slow resumption of operation of the limiting stage after any blocking of said limiting stage when the amplitude of the signal to be amplified has fallen back below the predetermined threshold.

* * * * *